United States Patent
Koo

(10) Patent No.: US 6,841,972 B2
(45) Date of Patent: Jan. 11, 2005

(54) METHOD FOR RESETTING A STATE OF CHARGE OF A BATTERY OF A HYBRID ELECTRIC VEHICLE

(75) Inventor: Jae-Seung Koo, Suwon (KR)

(73) Assignee: Hyundai Motor Company, Seoul (KR)

(*) Notice: Subject to any disclaimer, the term of this patent is extended or adjusted under 35 U.S.C. 154(b) by 0 days.

(21) Appl. No.: 10/326,014

(22) Filed: Dec. 18, 2002

(65) Prior Publication Data

US 2004/0119441 A1 Jun. 24, 2004

(30) Foreign Application Priority Data

Dec. 18, 2001 (KR) ........................................ 2001-80519

(51) Int. Cl.⁷ ................................................. H02J 7/00
(52) U.S. Cl. ..................................... 320/132; 320/136
(58) Field of Search ................................ 320/132, 130, 320/134, 135, 136, 149, 160; 324/425, 426, 427; 340/636

(56) References Cited

U.S. PATENT DOCUMENTS 5,115,182 A * 5/1992 Ehmke et al. .............. 320/136
5,539,318 A * 7/1996 Sasaki ........................ 324/428

* cited by examiner

Primary Examiner—Micheal Sherry
Assistant Examiner—Lawrence Luk
(74) Attorney, Agent, or Firm—Morgan Lewis & Bockius LLP

(57) ABSTRACT

A method for resetting a state of charge of a battery for a hybrid electric vehicle comprises: determining whether a discharge current of the battery is greater than a predetermined discharge current; determining whether a minimum voltage module has changed, if the discharge current of the battery is greater than the predetermined discharge current; determining whether a theoretical discharge voltage is greater than a voltage of the minimum voltage module, if the minimum voltage module has changed; determining whether the theoretical discharge voltage remains greater than the voltage of the minimum voltage module for a predetermined period of time, if the theoretical discharge voltage is greater than the voltage of the minimum voltage module; and setting a state of charge of the battery as a very low state, if the theoretical discharge voltage remains greater than the voltage of the minimum voltage module for the predetermined period of time.

4 Claims, 4 Drawing Sheets

METHOD FOR RESETTING A STATE OF CHARGE OF A BATTERY OF A HYBRID ELECTRIC VEHICLE

FIELD OF THE INVENTION

The present invention relates to a hybrid electric vehicle, and more particularly, to a method for resetting a state of charge of a battery of a hybrid electric vehicle to reduce a cumulative error of the state of charge of the battery.

BACKGROUND OF THE INVENTION

While a pure electric vehicle uses a battery as a power source, a hybrid-engine electric vehicle and a fuel-cell hybrid electric vehicle use a battery as a energy buffer. In these electric vehicles, the battery is an important device that directly relates to the efficiency of the vehicle.

A battery management system (BMS) manages overall states of the battery, and controls the battery so that it operates in an optimal condition to maximize its lifespan. The battery management system supports charge generation control and driving control by providing state of charge (SOC) information to a vehicle controller that maintains overall control of the electric vehicle. Generally, the state of charge of a battery is defined to be the ratio of the remaining capacity of the battery to the fully-charged capacity of the battery. If the state of charge information is inaccurate, i.e., if it contains errors, the ability of the battery management system to effectively manage and optimize the battery operation is reduced.

Examples of functions of the battery management system include: (1) estimating a state of charge of the battery; (2) detecting a full charge; (3) maintaining an equilibrium of voltages between cell modules of the battery; (4) controlling maximum charge and discharge voltages in accordance with the state of charge (SOC) of the battery; and (5) performing battery safety and cooling control.

To calculate a current state of charge of the battery, a battery management system generally measures the amount of charge current and discharge current. To make these calculations, an analog signal, which is detected by a current sensor, must be converted to a digital signal. During the conversion, an error corresponding to the amount of current measured, and hence the state of charge, typically accumulates. This error can lead to inaccurate management and control by the battery management system. To reduce the cumulative error, better A/D converters and increased-accuracy current sensors must be used, increasing the cost of the system.

Other sources of error for the state of charge measurement include self-discharge of battery voltage through internal battery resistance, and temperature inefficiencies of the battery.

In a pure electric vehicle, which applies a standardized charging method and uses the battery as an energy source, the SOC is reset to 100% after the battery is fully charged, thus reducing the effect of the cumulative error even though the error remains after the full charge.

However, in a hybrid-engine electric vehicle and a fuel-cell hybrid electric vehicle, which use the battery as an energy buffer, the battery is not fully charged at certain periods, and must continuously operate within a specific range of SOC. Yet, in these vehicles, the SOC of the battery is determined by various parameters that are dynamically changing according to various conditions. Consequently, it is difficult to estimate the SOC of the battery, and the cumulative error increases as the operating time of the battery increases. If the cumulative error is not compensated for, the battery may operate beyond an operating range of the SOC, potentially reducing the lifespan of the battery and decreasing the energy efficiency of the battery. Also, the voltage of the battery may become larger than a maximum-allowed system operating voltage.

The Korean Utility Model application no. 10-2000-82936 teaches a method to estimate a state of charge through battery charge/discharge terminal voltages, based on an inherent internal resistance of the battery according to the state of charge. However, because hybrid electrical systems have a dynamic charge/discharge cycle, this method is not well-suited to hybrid electric vehicles.

The information disclosed in this Background section is only for enhancement of understanding of the background of the invention and should not be taken as an acknowledgement or suggestion that this information forms the prior art that is already known to a person skilled in the art.

SUMMARY OF THE INVENTION

While the steps of the following methods of preferred embodiments of the present invention are numbered for purposes of clarity, the numbers are not meant to indicate that the steps of the methods must be performed in any numerical order.

In a preferred embodiment of the present invention, the method for resetting a state of charge of a battery for a hybrid electric vehicle comprises: (1) determining whether a discharge current of the battery is greater than a predetermined discharge current; (2) determining whether a minimum voltage module has changed, if the discharge current of the battery is greater than the predetermined discharge current; (3) determining whether a theoretical discharge voltage is greater than a voltage of the minimum voltage module, if the minimum voltage module has changed; (4) determining whether the theoretical discharge voltage remains greater than the voltage of the minimum voltage module for a predetermined period of time, if the theoretical discharge voltage is greater than the voltage of the minimum voltage module; and (5) setting a state of charge of the battery as a very low state, if the theoretical discharge voltage remains greater than the voltage of the minimum voltage module for the predetermined period of time.

It is preferable that the method further comprises: (1) determining whether the theoretical discharge voltage is greater than an average voltage of a plurality of modules of the battery, if the theoretical discharge voltage is not greater than the voltage of the minimum voltage module; (2) determining whether the theoretical discharge voltage remains greater than the average voltage for a predetermined period of time, if the theoretical discharge voltage is greater than the average voltage; and (3) setting a state of charge of the battery as a low SOC state, if the theoretical discharge voltage remains greater than the average voltage for the predetermined period of time.

It is also preferable that the theoretical discharge voltage is calculated based on a voltage caused by an internal resistance and a no-load voltage.

In another preferred embodiment of the present invention, the method for resetting a state of charge of a battery for a hybrid electric vehicle comprises: (1) determining whether a charge current of the battery is greater than a predetermined charge current; (2) determining whether a maximum voltage module has changed, if the charge current of the battery is greater than the predetermined charge current; (3) determining whether a theoretical charge voltage is less than a voltage of the maximum voltage module, if the maximum voltage module has changed; (4) determining whether the theoretical charge voltage remains less than the voltage of the maximum voltage module for a predetermined period of time, if the theoretical charge voltage is less than the voltage of the maximum voltage module; and (5) setting a state of charge of the battery as a very high state, if the theoretical charge voltage remains less than the voltage of the maximum voltage module for the predetermined period of time.

It is also preferable that the method further comprises: (1) determining whether the theoretical charge voltage is less than an average voltage of a plurality of modules of the battery, if the theoretical charge voltage is not less than the voltage of the maximum voltage module; (2) determining whether the theoretical charge voltage remains less than the average voltage for a predetermined period of time, if the theoretical charge voltage is less than the average voltage; and (3) setting a state of charge of the battery as a high SOC state, if the theoretical charge voltage remains less than the average voltage for the predetermined period of time.

It is further preferable that the theoretical charge voltage is calculated based on a voltage caused by an internal resistance and a no-load voltage.

In another preferred embodiment of the present invention, a method of improving accuracy of measuring a state of charge of a battery for a hybrid electric vehicle includes dividing a voltage of a full state of charge of the battery into a plurality of charge states. The plurality of charge states have a plurality of transition charge values defining boundaries between the charge states. The method also comprises measuring a state of charge of the battery; determining when the battery is in steady-state; and resetting the measured state of charge of the battery to a first transition charge value when: (a) the state of charge of the battery crosses the first transition charge value of the plurality of charge values, and (b) the battery is determined to be in steady-state.

Preferably, the plurality of charge states of the method include at least one of a very high, high, normal, low, and very low charge states.

BRIEF DESCRIPTION OF THE DRAWINGS

The accompanying drawings, which are incorporated in and constitute a part of the specification, illustrate an embodiment of the invention, and, together with the description, serve to explain the principles of the invention, where.

DETAILED DESCRIPTION OF THE PREFERRED EMBODIMENTS

Hereinafter, a preferred embodiment of the present invention will be described in detail with reference to the accompanying drawings.

Figure 1:
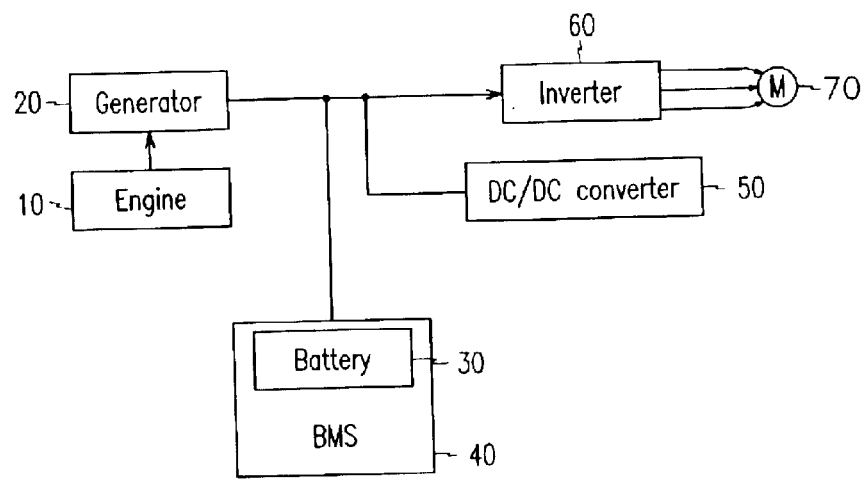
FIG. 1 is a schematic diagram of a power generation system of a general series-type, hybrid-engine electric vehicle.

As shown in FIG. 1, a power generation system of a general series-type engine hybrid electric vehicle comprises an engine 10, a generator 20, a battery 30, a battery management system (BMS) 40, a DC/DC converter 50, an inverter 60, and a motor 70.

The engine 10 generates power through combustion of fuel, and the generator 20 is driven by the engine to generate electric power of a predetermined voltage level. The battery 30 stores excess power output from the generator 20, and provides power to the motor 70 when the power output from the generator 20 is less than the amount of torque demanded by motor 70. At steady-state, battery 30 has an internal resistance, and the voltage across the terminals of the battery is defined as a sum of the voltage caused by the internal resistance and a no-load voltage. As used herein, this battery voltage is referred to as a theoretical battery voltage.

The inverter 60 communicates with a motor control unit (not shown), and provides the power of the battery 30 to the motor 70 by switching an IGBT through pulse width modulation control, under control of the motor control unit, to operate the motor 70. The DC/DC converter 50 converts the level of the DC voltage provided to the motor 70 to a predetermined voltage level.

The battery management system 40 detects current, voltage, and temperatures in the operating range of the battery 30, and applies controls to maintain a suitable state-of-charge (SOC), and manage the SOC of the battery 30.

As mentioned above, the state of charge (SOC) of the battery 30 is typically defined as the ratio of the remaining capacity of the battery to its fully-charged capacity. However, for purposes of the present invention, the SOC is defined as the ratio of the amount of currently-available capacity of the battery to the amount of total-available capacity. In other words, the SOC indicates a state-of-health (SOH) of the battery, which is generally defined as the ability to perform a specified task. The SOH of the battery reflects various factors of the battery, such as temperature change, high-rate discharge efficiency, and decrease of the battery capacity caused by deterioration of the battery.

Figure 4:
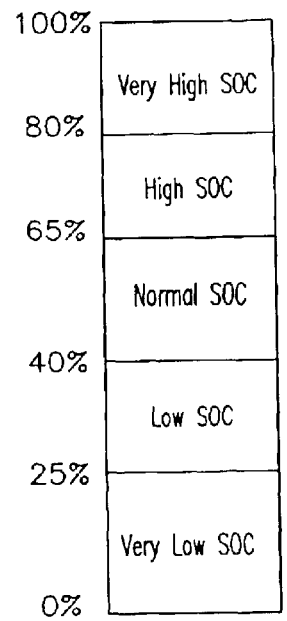
FIG. 4 shows an example of the status of the state of charge of the battery in a hybrid electric vehicle, according to one preferred embodiment of the present invention.

In order to manage the SOC of the battery 30, various classifications of the SOC are made as shown in FIG. 4. For example, the SOC status is set to a Very High state when the SOC of the battery 30 is maintained above 80%; to a High state when the SOC of the battery 30 is maintained within a range of 65%~80%; to a Normal state when the SOC of the battery 30 is maintained within a range of 40%~65%; to a Low state when the SOC of the battery 30 is maintained within a range of 25%~40%; and to a Very Low state when the SOC of the battery 30 is maintained below 25%.

Preferably, the battery management system 40 controls the amount of power generation to adjust the SOC to a predetermined level (e.g., 55% SOC), in accordance with engine efficiency and vehicle operating conditions. As will be explained in further detail below, the battery management system "resets" the state of charge of the battery to the predetermined levels based on various algorithms. Exemplary reset points include 25% SOC, 40% SOC, 65% SOC, 85% SOC, etc.

Figure 2:
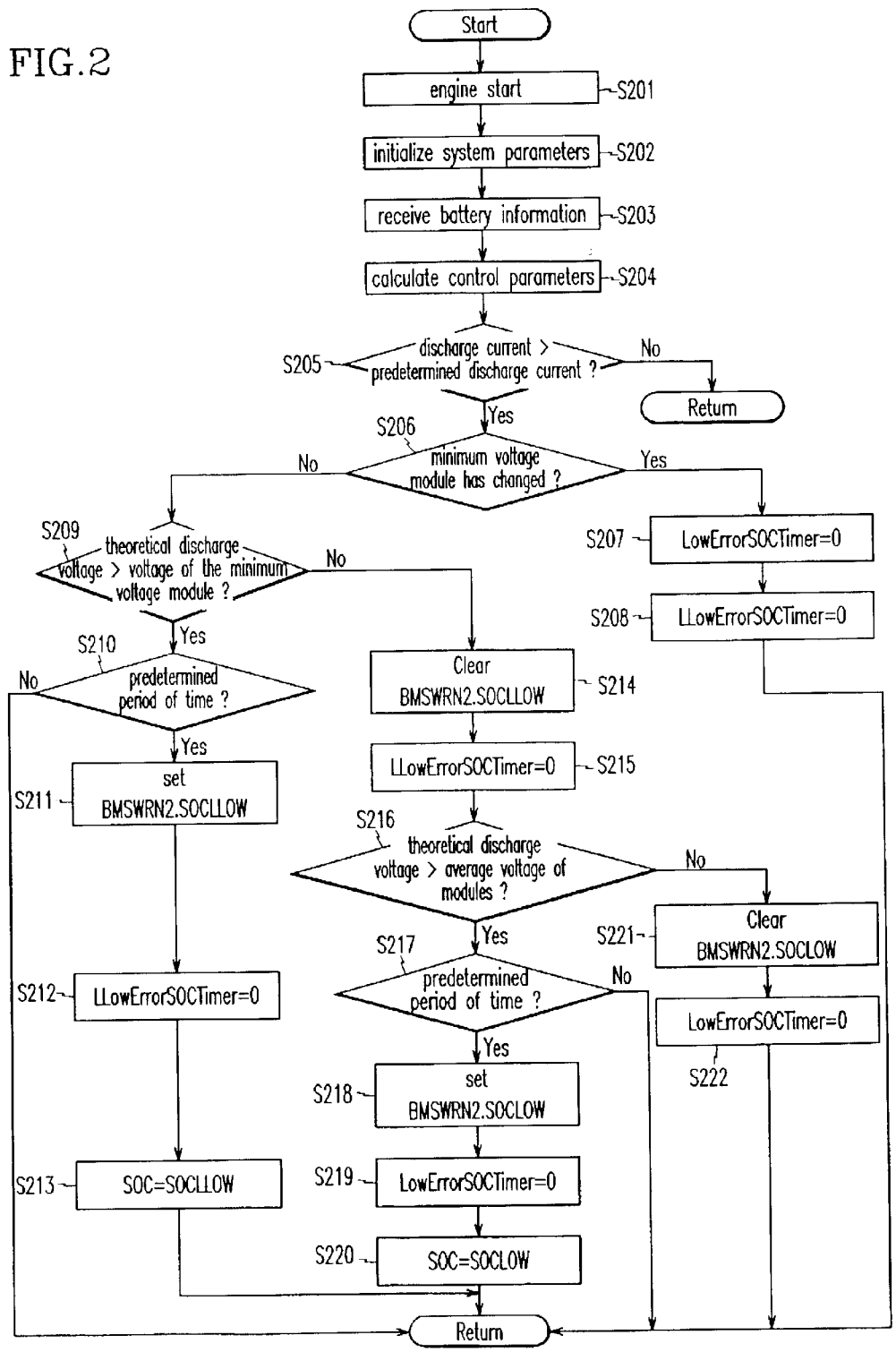
FIG. 2 is a flowchart of a method for resetting the state of charge of the battery during a discharge mode of the battery of a hybrid electric vehicle, according to a preferred embodiment of the present invention.

Referring to FIG. 2, a method for resetting the SOC of a battery during a discharge mode of the battery of the hybrid electric vehicle, according to a preferred embodiment of the present invention, is shown. In this method, the battery management system 40 initializes all system parameters (S202) for managing the battery 30 when the engine 10 starts (S201); receives battery information such as discharge current information, discharge voltage information, and temperature information (S203); and calculates control parameters through a predetermined algorithm (S204).

The calculated control parameters include various flags and timers for use in the present method, and include the theoretical battery voltage and the SOC of the battery that are calculated from battery information. The theoretical battery voltage may be calculated based on the internal resistance and the no-load voltage of the battery. Hereinafter, the theoretical battery voltage calculated during the discharge of the battery will be called the theoretical battery discharge voltage.

Next, the battery management system determines whether a present discharge current is greater than a predetermined discharge current (S205). (An example of a predetermined discharge current is 12A). If the present discharge current is not greater than the predetermined discharge current, the procedure returns to the start.

If, however, the present discharge current is determined to be greater than the predetermined discharge current, the battery management system next determines whether the number of the "minimum voltage module" has changed (S206). The battery is comprised of a set of modules, and the module whose voltage is lowest is designated as the minimum voltage module. Thus, if the minimum voltage module changes from one module to another, the number of the minimum voltage module has changed.

If it is determined that the number of the minimum voltage module has changed, the battery management system clears (i.e., resets) a low-SOC error counter LowErrorSOCTimer (S207), and clears (resets) a very-low-SOC error counter LLowErrorTimer (S208).

On the other hand, if the minimum voltage module has not changed, the battery management system next determines whether the theoretical discharge voltage, which has been calculated based on the internal resistance and the no-load voltage, is greater than the measured discharge voltage of the minimum voltage module (S209). The measured minimum discharge voltage is the voltage of the minimum voltage module, as defined above.

If the theoretical discharge voltage is determined to be greater than the minimum discharge voltage, the battery management system next determines whether this state remains true for a predetermined period of time (S210). (An example of the predetermined period of time is 3 seconds). If the theoretical discharge voltage does not remain greater than the minimum discharge voltage for the predetermined period of time, the procedure returns to the start.

If, however, it is determined that the theoretical discharge voltage does remain greater than the minimum discharge voltage for the predetermined period of time, the battery management system sets a very low SOC warning (S211), clears an error counter for the very low SOC (S212), and resets the SOC as the very low SOC state (SOC=SOCLLOW) (S213).

Referring back to step S209, if the theoretical discharge voltage is not greater than the minimum discharge voltage, the battery management system clears a very low SOC warning (S214), and clears an error counter for a very low SOC (LLowErrorSOCTimer) (S215).

Next, the battery management system determines whether the theoretical discharge voltage is greater than an average voltage of all of the modules of the battery (S216). If the theoretical discharge voltage is not greater than the average voltage, the battery management system clears a low SOC warning (S221), and clears an error counter for a low SOC (LowErrorSOCTimer) (S222).

If instead the theoretical discharge voltage is determined to be greater than the average discharge voltage, the battery management system next determines whether this fact remains true for a predetermined period of time (S217). Again, the predetermined period may be 3 seconds. If the theoretical discharge voltage does not remain greater than the average voltage for the predetermined period of time, the procedure returns to the start.

On the other hand, if the theoretical discharge voltage remains greater than the average discharge voltage for the predetermined period of time, the battery management system sets a low SOC warning (S218), clears an error counter for a low SOC (S219), and resets the SOC as a low SOC (SOC=SOCLOW) (S220).

Figure 3:
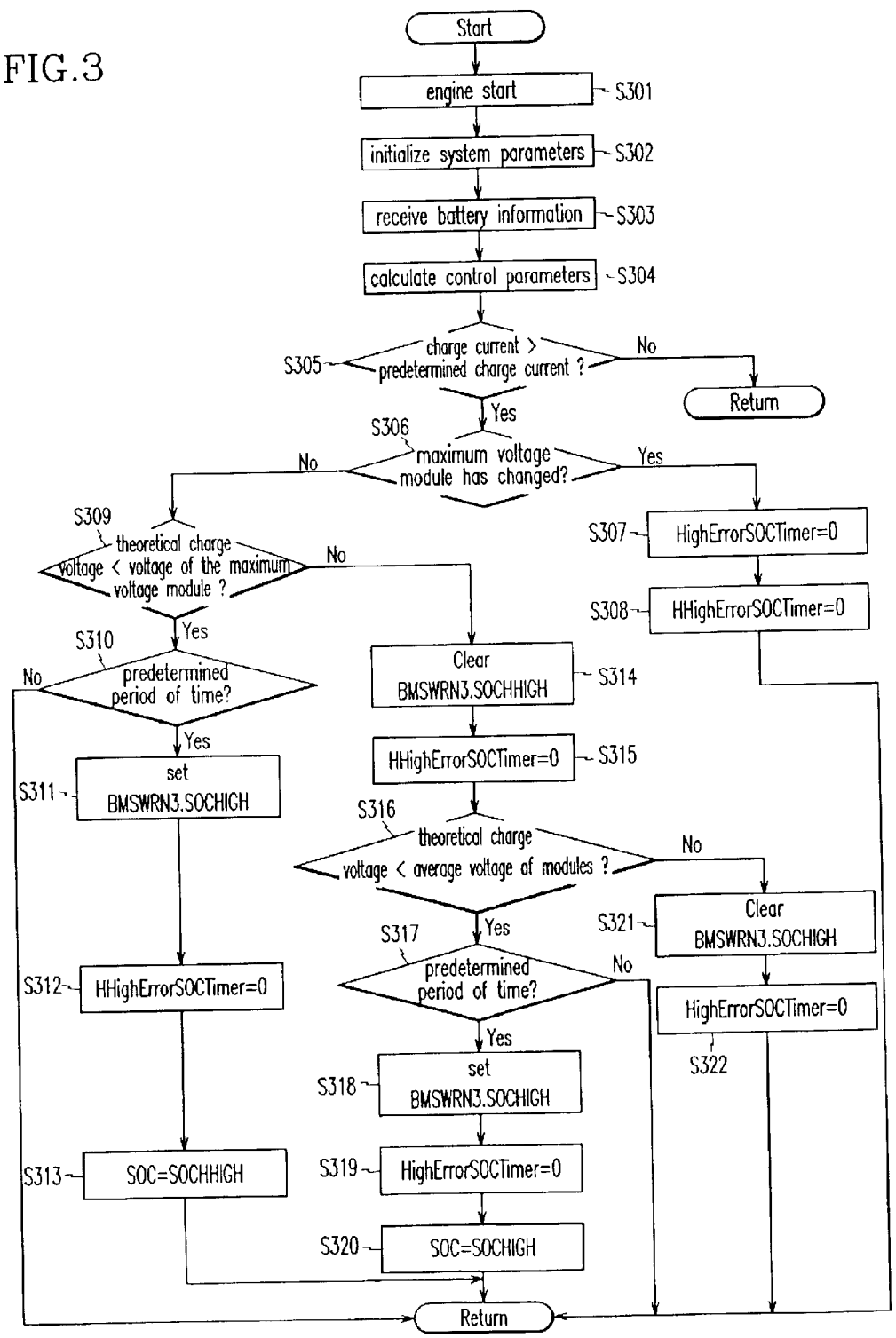
FIG. 3 is a flowchart of a method for resetting the state of charge of the battery during a charge mode of the battery of a hybrid electric vehicle, according to another preferred embodiment of the present invention.

Referring now to FIG. 3, a method for resetting the SOC of a battery during a charge mode of the battery of the hybrid electric vehicle, in accordance with a preferred embodiment of the present invention, is shown. In this embodiment, the battery management system 40 initializes all system parameters for managing the battery (S302); receives battery information such as charge current information, charge voltage information, and temperature information (S303); and calculates control parameters through a predetermined algorithm (S304).

The calculated control parameters include various flags and timers for use in the present method, and include the internal resistance (IR) voltage and a value of the state of charge of the battery, calculated with battery information. The IR voltage may be calculated based on the internal resistance and the no-load voltage. The IR voltage during charging of the battery is herein referred to as the theoretical battery charge voltage.

The battery management system 40 first determines whether a present charge current is greater than a predetermined charge current (S305). (An example of a predetermined charge current is 12A). If the present charge current is not greater than the predetermined charge current, the procedure returns to the initial step.

If, on the other hand, the present charge current is determined to be greater than the predetermined charge current, the battery management system 40 next determines whether the number of the "maximum voltage module" has changed (S306). The battery is comprised of a set of modules, and the module whose voltage is highest is the maximum voltage module. Thus, if the maximum voltage module changes from one module to another, the number of the maximum voltage module changes.

If the number of the maximum voltage module has changed, the battery management system 40 clears a high SOC error counter (HighErrorSOCTimer) (S307), and clears a very high SOC error counter HHighErrorSOCTimer (S308). If, on the other hand, the maximum voltage module has not changed, the battery management system next determines whether the theoretical charge voltage, which has been calculated based on the internal resistance and the no-load voltage, is less than a measured maximum charge voltage (S309). The measured maximum charge voltage is the voltage of the module whose voltage is highest among all modules that the battery consists of.

If the theoretical charge voltage is determined to be less than the maximum charge voltage, the battery management next determines whether this state remains true for a predetermined period of time (S310). (An example of the predetermined period of time may be 3 seconds). If the theoretical charge voltage does not remain less than the maximum charge voltage for the predetermined period of time, the procedure returns to the start.

If, on the other hand, the theoretical charge voltage does remain less than the maximum charge voltage for the predetermined period of time, the battery management system sets a high SOC warning (S311), clears an error counter for the very high SOC (S312) and resets the SOC as the very high SOC state (SOC=SOCHHIGH) (S313).

Referring back to step S309, if the theoretical charge voltage is not less than the maximum charge voltage, the battery management system clears a very high SOC warning (S314), and clears an error counter for a very high SOC (HHighErrorSOCTimer) (S315).

The battery management system next determines whether the theoretical charge voltage is less than the average voltage of all of the modules of the battery (S316). If the theoretical charge voltage is determined not to be less than the average voltage, the battery management system clears a high SOC warning (S321), and clears an error counter for a high SOC (HighErrorSOCTimer) (S322).

Alternatively, if the theoretical charge voltage is determined to be less than the average charge voltage, then the battery management system next determines whether this state remains true for a predetermined period of time (S317). (For example, the predetermined period of time may be 3 seconds). If the theoretical charge voltage remains less than the average charge voltage for the predetermined period of time, the procedure returns to the start.

On the other hand, if the theoretical charge voltage remains less than the average charge voltage for the predetermined period of time, the battery management system sets a high SOC warning (S318), clears an error counter for a high SOC (S319), and resets SOC as a high SOC (SOC=SOCHIGH) (S320).

For the battery to be considered to be in steady-state during discharging, the real battery voltage must be less than the internal resistance voltage, and must gradually decrease when the battery voltage approaches a boundary between different SOC classifications (e.g., at the low to very low SOC boundary at 25% SOC), corresponding to a reset. However, if the battery voltage gradually increases for a few seconds, the battery is determined to be in a transient state instead.

For the battery to be in steady-state during charging, the real battery voltage must be greater than the internal resistance voltage, and must also only gradually increase at the SOC reset boundaries. However, if the battery voltage gradually decreases, the battery is determined to be in a transient state.

Figure 5:
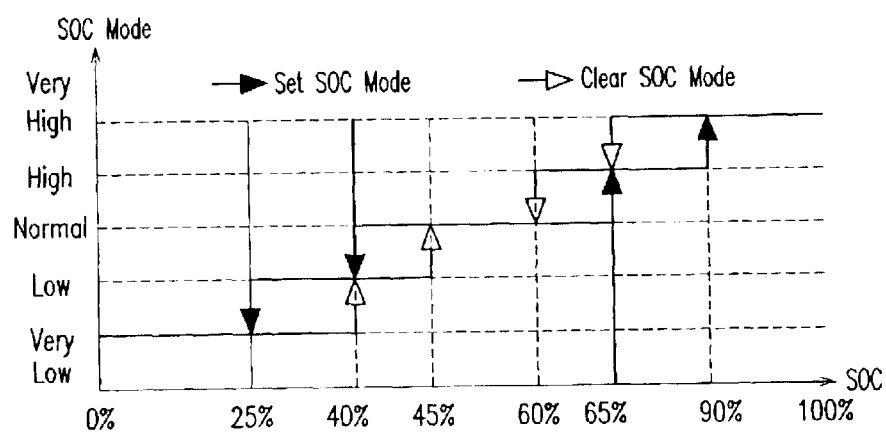
FIG. 5 is a diagram of the state of charge status transition in a hybrid electric vehicle, according to another preferred embodiment of the present invention.

Referring to FIG. 5, a diagram of SOC status and SOC transitions is shown. For example, during battery discharging, the SOC is reset to 40% when the battery discharge voltage state changes from the very high state, high state, or normal state to the low state (represented by the "set SOC mode" arrow at 40% SOC). In other words, when the internal resistance voltage corresponding to the current SOC state is less than the internal resistance voltage corresponding to the low state, and the battery is in steady-state, the battery management system resets the battery SOC state to 40%, and stores this value in a memory. Similarly, the SOC is reset to 25% when the battery charge voltage state changes from the low state to the very low state.

For battery charging, the SOC is reset to 65% when the battery charge voltage state is changed from the very low state, low state, or normal state to the high state, and is reset to 80% when the battery charge voltage state is changed from the high state to the very high state. In other words, if the internal resistance voltage corresponding to the current SOC state is greater than the internal resistance voltage corresponding to the high SOC state or the very high SOC state, and the battery is in the steady-state, the battery management system resets the battery SOC state (e.g., to 65% corresponding to the high state, and to 80% corresponding to the very high state). The battery management system stores the reset SOC state in a memory.

As explained above, the SOC state is reset based on the battery voltage and the battery current, when the battery voltage passes through the predetermined SOC points, in order to reduce a cumulative error of the SOC. This helps reduce battery damage caused by the SOC error, and increases and the energy efficiency of battery charging and discharging.

Although preferred embodiments of the present invention have been described in detail hereinabove, it should be clearly understood that many variations and/or modifications of the basic inventive concepts herein taught which may appear to those skilled in the present art will still fall within the sprit and scope of the present invention, as defined in the appended claims.

Throughout this specification and the claims which follow, unless explicitly described to the contrary, the word "comprise" or variations such as "comprises" or "comprising" will be understood to imply the inclusion of stated elements but not the exclusion of any other elements.

What is claimed is:

1. A method for resetting a state of charge of a battery for a hybrid electric vehicle, comprising:

determining whether a discharge current of the battery is greater than a predetermined discharge current;

determining whether a minimum voltage module has changed, if the discharge current of the battery is greater than the predetermined discharge current;

determining whether a theoretical discharge voltage is greater than a voltage of the minimum voltage module, if the minimum voltage module has changed;

determining whether the theoretical discharge voltage remains greater than the voltage of the minimum voltage module for a predetermined period of time, if the theoretical discharge voltage is greater than the voltage of the minimum voltage module;

setting a state of charge of the battery as a very low state, if the theoretical discharge voltage remains greater than the voltage of the minimum voltage module for the predetermined period of time;

determining whether the theoretical discharge voltage is greater than average voltage of a plurality of modules of the battery, if the theoretical discharge voltage is not greater than the voltage of the minimum voltage module;

determining whether the theoretical discharge voltage remains greater than the average voltage for a predetermined period of time, if the theoretical discharge voltage is greater than the average voltage; and setting a state of charge of the battery as a low SOC state, if the theoretical discharge voltage remains greater than the average voltage for the predetermined period of time.

2. The method of claim 1, wherein the theoretical discharge voltage is calculated based on a voltage caused by an internal resistance and no-load voltage.

3. A method for resetting a state of charge of a battery for a hybrid electric vehicle, comprising:

determining whether a charge current of the battery is greater than a predetermined charge current;

determining whether a maximum voltage module has changed if the charge current of the battery is greater than the predetermined charge current;

determining whether a theoretical charge voltage is less than a voltage of the maximum voltage module, if the maximum voltage module has changed;

determining whether at the theoretical charge voltage remains less than the voltage of the maximum voltage module for a predetermined period of time, if the theoretical charge voltage is less than the voltage of the maximum voltage module;

setting a state of charge of the battery as a very high state, if the theoretical charge voltage remains less than the voltage of the maximum voltage module for the predetermined period of time;

determining whether the theoretical charge voltage is less than an average voltage of a plurality of modules of the battery, if the theoretical charge voltage is not less than the voltage of the maximum voltage module;

determining whether the theoretical charge voltage remains less than the average voltage for a predetermined period of time, if the theoretical charge voltage is less than the average voltage; and setting a state of charge of the battery as a high SOC state, if the theoretical charge voltage remains less than the average voltage for the predetermined period of time.

4. The method of claim 3, wherein the theoretical charge voltage is calculated based on a voltage caused by an internal resistance and no-load voltage.

* * * * *